(12) United States Patent
Kuo

(10) Patent No.: US 7,057,903 B2
(45) Date of Patent: Jun. 6, 2006

(54) INTERFACE CARD FIXTURE FOR A COMPUTER SYSTEM

(75) Inventor: Yi Lung Kuo, Keelung (TW)

(73) Assignee: Shuttle Inc. (TW)

( * ) Notice: Subject to any disclaimer, the term of this patent is extended or adjusted under 35 U.S.C. 154(b) by 0 days.

(21) Appl. No.: 10/806,730

(22) Filed: Mar. 22, 2004

(65) Prior Publication Data

US 2004/0246694 A1 Dec. 9, 2004

Related U.S. Application Data

(60) Provisional application No. 60/456,352, filed on Mar. 20, 2003.

(51) Int. Cl.
*H05K 7/12* (2006.01)
*H05K 7/14* (2006.01)

(52) U.S. Cl. ................ 361/801; 361/759; 361/732; 361/683; 312/223.1

(58) Field of Classification Search ............. 361/801, 361/759, 732, 730, 796–798, 683; 312/223.1, 312/223.2
See application file for complete search history.

(56) References Cited

U.S. PATENT DOCUMENTS

| | | | | |
|---|---|---|---|---|
| 5,601,349 A | * | 2/1997 | Holt | 312/265.6 |
| 6,049,449 A | * | 4/2000 | Cranston et al. | 361/683 |
| 6,138,839 A | * | 10/2000 | Cranston et al. | 211/41.17 |
| 6,160,712 A | * | 12/2000 | Itai et al. | 361/759 |
| 6,278,614 B1 | * | 8/2001 | Beaman et al. | 361/752 |
| 6,442,038 B1 | * | 8/2002 | Erickson et al. | 361/759 |
| 6,480,393 B1 | * | 11/2002 | Chen | 361/759 |
| 6,487,089 B1 | * | 11/2002 | Otis | 361/796 |
| 6,618,263 B1 | * | 9/2003 | Kin-Wing et al. | 361/759 |
| 6,618,264 B1 | * | 9/2003 | Megason et al. | 361/759 |
| 6,639,151 B1 | * | 10/2003 | Chen et al. | 174/65 R |
| 6,655,761 B1 | * | 12/2003 | Chen | 312/223.2 |
| 6,693,800 B1 | * | 2/2004 | Lin et al. | 361/759 |
| 6,704,205 B1 | * | 3/2004 | Chen | 361/740 |
| 6,834,766 B1 | * | 12/2004 | Lin et al. | 211/41.17 |

* cited by examiner

*Primary Examiner*—Kamand Cuneo
*Assistant Examiner*—Dameon E. Levi
(74) *Attorney, Agent, or Firm*—Fenwick & West LLP

(57) ABSTRACT

A fixture assembly for securing a card in a computer includes a computer chassis with at least one slot opening and a window above the slot opening. A card is installed in the computer so that an external interface of the card matches up with a slot opening in the chassis, and an extension of a bracket attached to the card protrudes through the window. To secure the card in place, a clamp is attached over the window, where the clamp includes one or more outward folds to press against the extension of the bracket. The card's bracket may further extend through openings in the bottom of the chassis to improve the securing of the card.

10 Claims, 2 Drawing Sheets

INTERFACE CARD FIXTURE FOR A COMPUTER SYSTEM

CROSS REFERENCE TO RELATED APPLICATIONS

This application claims the benefit of U.S. Provisional Application No. 60/456,352, filed Mar. 20, 2003, which is hereby incorporated in its entirety by reference.

BACKGROUND

1. Field of the Invention

The present invention relates to mounting an interface card within a computer housing.

2. Background of the Invention

To achieve certain functionalities, personal computers are usually connected to corresponding peripheral components. One mechanism for connecting a computer to a peripheral component is with a PCI (peripheral component interconnect) interface, which allows the computer's motherboard to be connected to a PCI card. PCI cards include network cards, modems, and many other types of devices.

In a typical computer system, a motherboard is integrated with PCI slots to enable customers to plug different PCI cards into the computer for processing output signals. For this reason, the computer chassis typically includes multiple slot openings covered with clamps, which hold the card in place and can be removed before and restored after plugging PCI cards onto the slots. This has been the prevailing configuration of computer chassis.

The stability of the PCI cards in the slots, and hence their reliability, depend on their firm installation. Any failure in this respect may affect the operation of the computer.

SUMMARY OF THE INVENTION

To provide a mechanical interface by which PCI and other cards can be mounted to a motherboard and within a computer chassis, a fixture assembly includes a computer chassis with at least one slot opening and a window above the slot opening. A card can be installed in the computer, for example into a slot on the motherboard inside the computer, so that an external interface of the card matches up with a slot opening in the chassis, and an extension of a bracket attached to the card protrudes through the window. To secure the card in place, a clamp is attached over the window, where the clamp includes one or more outward folds to press against the extension of the bracket. The card's bracket may further extend through openings in the bottom of the chassis to improve the securing of the card. When a card is installed within the computer, therefore, its bracket seals the slot opening in the chassis while the extension protrudes from the window in the chassis, and the clamp fixes the card in place. The clamp may be fastened onto the chassis over the window thereof with screws or any other suitable fastening mechanism.

DETAILED DESCRIPTION OF THE PREFERRED EMBODIMENTS

Figure 1:
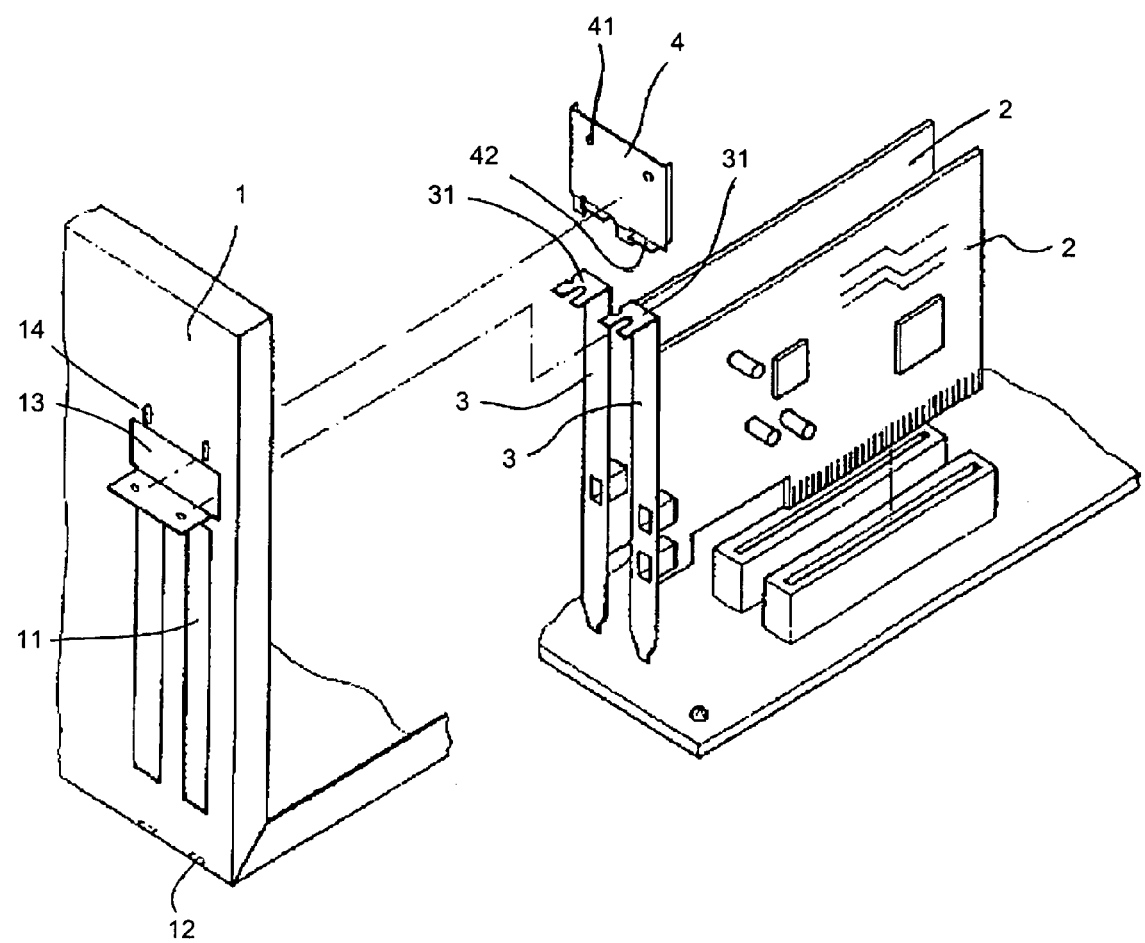
FIG. 1 shows an exploded view of the card fixture system in accordance with an embodiment of the invention.

A computer card fixture system and method of installation are described with reference to a typical embodiment of a personal computer, although the invention can be applied to any number of computing systems. As shown in FIG. 1, the computer includes a computer chassis 1, one or more cards 2 to be installed in the computer chassis 1, and a securing clamp 4. The card 2 may be any type of card configured to be coupled to the motherboard of a computer (e.g., through a socket thereon) and secure within the computer chassis 1. For example, the card 2 may be any type of standard interface card that allows the computer to communicate with an external device. In addition, or alternatively, the card 2 may be a standard PCI (peripheral component interconnect) card, an AGP (accelerated graphics port) card, a network card, a modem, or any other suitable card for insertion in a computer system. Such cards typically include external terminals for connection to other devices and bottom terminals for plugging into slots on a motherboard.

The computer chassis 1 accommodates a motherboard and any other internal components or devices for the computer. The chassis 1 includes one or more vertical slot openings 11 that allow external devices to be connected to any installed cards 2. Generally, the number of openings 11 corresponds to the number of slots in the motherboard for receiving the cards. In one embodiment, bottom openings 12 in the computer chassis 1 accommodate the lower end of the brackets 3, further helping to secure the cards 2 when installed.

In one embodiment, each card 2 includes a bracket 3, which provides the card 2 an interface to the outside of the chassis 1 when installed, and thus to external components and devices. The narrow brackets 3 fastened onto the PCI cards 2 may expose external terminals for connection with external devices through slot openings 11 in the computer chassis 1. Accordingly, the openings 11 are preferably dimensioned to correspond to the brackets 3 of the cards 2 intended for use with the computer. Often, the brackets 3 include an extension 31 that protrudes from one end of the bracket 3 at a right-angle design. This extension 31 facilitates the securing of the card 2 when installed in the computer.

The chassis 1 further includes a window 13 above the openings 11, as shown in FIG. 1. This window 13 enables the extension 31 of the bracket 3 to extend through the chassis 1. In addition, a pair of lock holes 14 is formed through the chassis 1 above the window 13. The clamp 4, preferably slightly larger than but corresponding to the window 13, is used to cover the window 13. The clamp 4 can be fixed onto the chassis 1 to cover the window 13 by screws or some other fastening mechanism through holes 41 and lock holes 14. The clamp 4 further includes outward folds 42 on its bottom side to match the brackets 3. When fixed onto the chassis 1 as described, therefore, the outward folds 42 of the clamp 4 secure the brackets 3, and thus the cards 2, in place.

Figure 2:
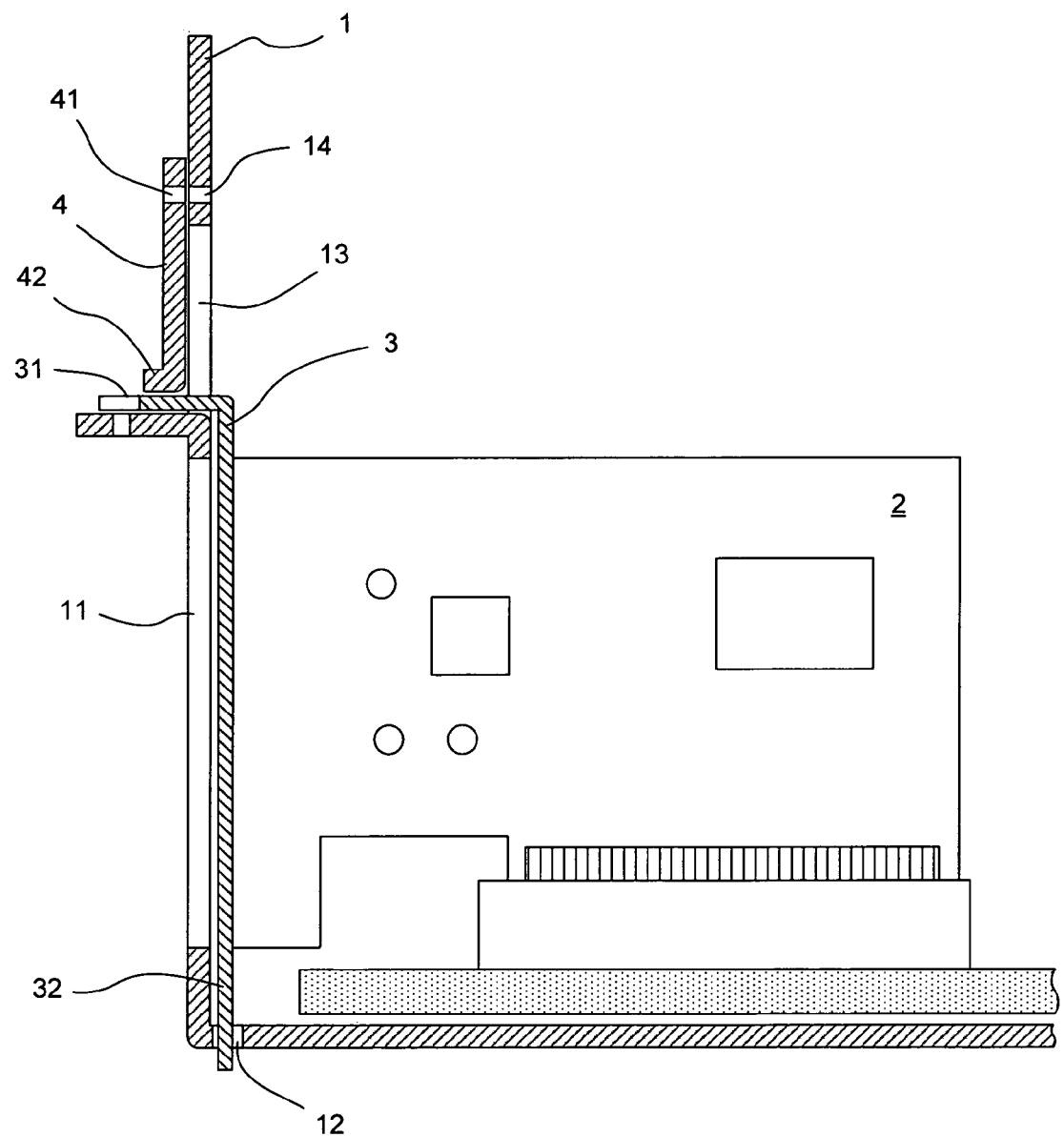
FIG. 2 shows an assembled side view of the card fixture system of FIG. 1, in accordance with an embodiment of the invention.

FIG. 2 is a side view of the computer system shown in the exploded assembly view of FIG. 1, illustrating the installation of a card 2 within a computer chassis 1. To install a card 2 and secure it within the chassis 1, according to one embodiment, a card 2 is installed into a slot of the motherboard so that the extension 31 of the bracket 31 protrudes out of the chassis 1 through the window 31. Before the card 2 is installed, however, it may be necessary to remove any protecting covers that are often found over openings 11 in a standard computer chassis 1. When installed, a lower end 32 of the bracket 3 may stick out of the bottom opening 12 of the chassis 1, as illustrated in FIG. 2, which helps to secure the card 2. Then, the clamp 4 is installed over the window, with its outward folds 42 matching the extension 31 of the bracket 3. The clamp 4 is fixed in that position by screws or other fasteners through the holes 41 and the lock holes 14. In this way, the clamp 4 secures the card 2 in place by securing its bracket 3, while the card 2 may be further secured at the opposite end 32 of its bracket 3 by the lower openings 12 of the chassis 1.

Although the brackets 3 may protrude from the bottom of the chassis 1, they preferably do not extend more than the height of a foot pad supporting the computer. In this way, the bracket 3 will not touch or scrape against a surface on which the computer is resting. Additionally, this configuration allows for lower positioned slot openings 11, helping to decrease the height of the computer chassis 1.

The foregoing description of the embodiments of the invention has been presented for the purposes of illustration and description. It is not intended to be exhaustive or to limit the invention to the precise forms disclosed. Persons skilled in the relevant art can appreciate that many modifications and variations are possible in light of the above teaching. It is therefore intended that the scope of the invention be limited not by this detailed description, but rather by the claims appended hereto.

I claim:

1. A system for securing a card installed within a computer system, the card including a bracket for providing the card with an interface to an external device, the system comprising:
   a computer chassis with at least one slot opening and a window above the slot opening, the slot opening corresponding to an interface for a card to be installed into the computer system, the chassis having a locating plate extending therefrom along at least a portion of an edge of the window, the chassis further having an opening in a bottom surface thereof, where the bottom surface and the window lie in intersecting planes; and
   a clamp configured to fit over the window of the chassis and press against an extension of the bracket of the card,
   wherein the system is configured so that when the card is installed in the computer system, an extension of the bracket of the card protrudes through the window of the chassis, the clamp presses against the extension to secure the card in place between the clamp and the locating plate of the chassis, and a lower end of the bracket extends through the opening in the bottom surface of the chassis.

2. The system of claim 1, wherein the clamp includes one or more outward folds that press against and secure the bracket when the card is installed.

3. The system of claim 1, wherein the clamp is fastened onto the chassis by one or more fasteners through corresponding holes in the clamp and the chassis.

4. The system of claim 3, wherein the fasteners are screws.

5. The system of claim 1, wherein the chassis includes a plurality of slot openings, and the window is located above the plurality of slot openings to receive extensions from brackets of cards installed for any of the slot openings.

6. A system for securing a card installed within a computer system, the card including a bracket for providing the card with an interface to an external device, the system comprising:
   a computer chassis with at least one slot opening and a window above the slot opening, the slot opening corresponding to an interface for a card to be installed into the computer system; and
   a clamp configured to fit over the window of the chassis and press against an extension of the bracket of the card, wherein when the card is installed in the computer system, an extension of the bracket of the card protrudes through the window of the chassis and the clamp presses against the extension to secure the card in place, and further when the card is installed a lower end of the bracket protrudes from an opening in a bottom surface of the chassis, where the bracket of the card intersects the bottom surface of the chassis when installed.

7. The system of claim 6, wherein the clamp includes one or more outward folds that press against and secure the bracket when the card is installed.

8. The system of claim 6, wherein the clamp is fastened onto the chassis by one or more fasteners through corresponding holes in the clamp and the chassis.

9. The system of claim 8, wherein the fasteners are screws.

10. The system of claim 6, wherein the chassis includes a plurality of slot openings, and the window is located above the plurality of slot openings to receive extensions from brackets of cards installed for any of the slot openings.

* * * * *

UNITED STATES PATENT AND TRADEMARK OFFICE
CERTIFICATE OF CORRECTION

| | |
|---|---|
| PATENT NO. | : 7,057,903 B2 |
| APPLICATION NO. | : 10/806730 |
| DATED | : June 6, 2006 |
| INVENTOR(S) | : Yi-Lung Kuo |

It is certified that error appears in the above-identified patent and that said Letters Patent is hereby corrected as shown below:

On page 1, at number 75, please change "Yi Lung Kuo" to --Yi-Lung Kuo.--

Signed and Sealed this

Seventeenth Day of October, 2006

JON W. DUDAS
*Director of the United States Patent and Trademark Office*